United States Patent
Chen et al.

(10) Patent No.: US 10,075,085 B2
(45) Date of Patent: Sep. 11, 2018

(54) GALLIUM NITRIDE DRIVER WITH TUNED DEAD-TIME

(71) Applicant: The Hong Kong University of Science and Technology, Kowloon, Hong Kong (CN)

(72) Inventors: Ziang Chen, Guangdong (CN); Tak Sang Yim, Hong Kong (CN); Yat To Wong, Hong Kong (CN); Wing Hung Ki, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 15/574,148

(22) PCT Filed: May 23, 2016

(86) PCT No.: PCT/CN2016/082962
§ 371 (c)(1),
(2) Date: Nov. 14, 2017

(87) PCT Pub. No.: WO2016/188385
PCT Pub. Date: Dec. 1, 2016

(65) Prior Publication Data
US 2018/0131282 A1    May 10, 2018

Related U.S. Application Data

(60) Provisional application No. 62/165,695, filed on May 22, 2015.

(51) Int. Cl.
*H02M 1/38* (2007.01)
*H02M 3/337* (2006.01)
(Continued)

(52) U.S. Cl.
CPC ........... *H02M 3/3376* (2013.01); *H02M 1/08* (2013.01); *H02M 1/38* (2013.01);
(Continued)

(58) Field of Classification Search
CPC ........ H02M 3/156; H02M 3/157; H02M 1/38; H02M 2001/385; H02M 2001/0012; H02M 1/158; H02M 1/1588
See application file for complete search history.

(56) References Cited

U.S. PATENT DOCUMENTS

| 5,578,911 A | 11/1996 | Carter et al. |
| 6,294,954 B1 | 9/2001 | Melanson |

(Continued)

FOREIGN PATENT DOCUMENTS

| CN | 102170286 A | 8/2011 |
| CN | 102195483 A | 9/2011 |

(Continued)

OTHER PUBLICATIONS

International Search Report for PCT Application No. PCT/CN2016/082962, dated Jul. 26, 2016, 4 pages.

(Continued)

*Primary Examiner* — Gary L Laxton
(74) *Attorney, Agent, or Firm* — Amin, Turocy & Watson, LLP

(57) ABSTRACT

Techniques are provided to tune a gate-drive control signal for a switching device. In an aspect, a device is provided that includes a dead-time generator circuit, a first dead-time tuner circuit and a second dead-time tuner circuit. The dead-time generator circuit generates a control signal for a first switching device that is coupled to a second switching device via a switching node. The first dead-time tuner circuit generates, based on the control signal and a switching signal indicative of a voltage associated with the switching node, a first (Continued)

modified control signal for the first switching device. The second dead-time tuner circuit generates, based on a modified version of the switching signal and a tuning process that repeatedly modifies the control signal until a first dead-time value satisfies a defined criterion, a second modified control signal for the first switching device.

20 Claims, 11 Drawing Sheets

(51) Int. Cl.
*H02M 3/335* (2006.01)
*H02M 1/08* (2006.01)
*H03K 17/687* (2006.01)
*H02M 3/157* (2006.01)

(52) U.S. Cl.
CPC ... *H02M 3/33523* (2013.01); *H02M 3/33592* (2013.01); *H03K 17/6871* (2013.01); *H02M 2001/385* (2013.01)

(56) References Cited

U.S. PATENT DOCUMENTS

| | | | |
|---|---|---|---|
| 7,034,609 | B2 | 4/2006 | Risbo et al. |
| 7,057,380 | B2 | 6/2006 | Kuo et al. |
| 8,324,880 | B2 * | 12/2012 | Wang ............... H02M 1/38 323/271 |
| 8,416,582 | B2 * | 4/2013 | Usui ............... H02M 3/3376 363/131 |
| 8,519,747 | B2 * | 8/2013 | Cho ............... H03K 17/162 327/108 |
| 9,525,358 | B2 | 12/2016 | Jin et al. |
| 2014/0167722 | A1 * | 6/2014 | Lee ............... H02M 1/38 323/282 |
| 2015/0340953 | A1 * | 11/2015 | Shook ............... G05F 1/10 323/271 |

FOREIGN PATENT DOCUMENTS

| | | |
|---|---|---|
| CN | 104270008 A | 1/2015 |
| JP | 01162901 A | 6/1989 |

OTHER PUBLICATIONS

B. J. Baliga, "Gallium nitride devices for power electronic applications," Semicond. Sci. Technol., vol. 28, No. 7, Jul. 2013.

A. Lidow, J. Strydom, M. de Rooji and Y. Ma, "GaN Transistors for Efficient Power Conversion", 1st ed. 2012. Second ed. 2015. Chapter 1 "GaN Technology Overview", 18 pages.

Briere, Mike. "600 V GAN on SI-Based Power Use GANPOWIR", Power Electronics Technology, Jun. 27, 2012, retrieved on Jul. 24, 2012, 2 pages.

S. Ji, D. Reusch, and F. C. Lee, "High-frequency high power density 3-D integrated gallium-nitride-based point of load module design," IEEE Trans. Power Electron., vol. 28, No. 9, Sep. 2013, pp. 4216-4226.

J. Strydom and D. Reusch, "Dead time optimization for maximum efficiency," White Paper: WP001, EPC, 2012, 6 pages.

B Murari et al., "Smart Power ICs: Technologies and Applications", Germany: Springer Press, 1996. 41 pages.

T. Man, P. Mok, and M. Chan, "An auto-selectable-frequency pulsewidth modulator for buck converters with improved light-load efficiency," IEEE Int. Solid-State Circ. Conf., Feb. 2008, pp. 440-441+626.

S. K. Manohar and P. T. Balsara, "94.6% peak efficiency DCM buck converter with fast adaptive dead-time control," European Solid-State Circ. Conf., Sep. 2013, pp. 153-156.

S. Mappus, "Predictive gate drive boosts synchronous dc/dc power converter efficiency," Appl. Rep. SLUA281, Texas Instruments, Apr. 2003. 26 pages.

"High-Efficiency Predictive Synchronous Buck Driver," Texas Instruments, Dallas, UCC27221/UCC27222 Datasheet, SLUS486B—Aug. 2001—Revised Jul. 2003, 34 pages.

Cardenas, et al. "Elimination of dead time effects in three phase inverters" IEEE CIEP, Oct. 1996, 5 pages.

Xue, et al. "A 99%-efficiency 1-MHz 1.6-kW zero-voltage-switching boost converter using normally-off GaN power transistors and adaptive dead-time controlled gate drivers", Electron Devices and Solid-State Circuits (EDSSC), 2013 IEEE International Conference of, IEEE 2013, 2 pages.

Macellari, et al. "Dead time generator for synchronous boost converters with GaN transistors", Electric Vehicle Conference (IEVC), 2014 IEEE International, IEEE 2014, 6 pages.

S. Lee, S. Jung, C. Park, C.-T. Rim, and G.-H. Cho, "Accurate Dead-Time Control for Synchronous Buck Converter With Fast Error Sensing Circuits," IEEE Trans. Circuit Syst. I: Reg. Papers, vol. 60, No. 11, pp. 3080-3089, Nov. 2013.

S. Mappus, "Predictive gate drive frequently asked Questions," Texas Instruments, SLUA285, Feb. 2003. 9 pages.

V. Yousefzadeh and D. Maksimovic, "Sensorless optimization of dead times in DC-DC converters with synchronous rectifiers," IEEE Trans. Power Electron., vol. 21, No. 4, pp. 994-1002, Jul. 2006.

* cited by examiner

GALLIUM NITRIDE DRIVER WITH TUNED DEAD-TIME

RELATED APPLICATION

This application a U.S. National Stage filing under 35 U.S.C. § 371 of international patent cooperation treaty (PCT) application No. PCT/CN2016/082962, filed May 23, 2016, and entitled "GALLIUM NITRIDE DRIVER WITH TUNED DEAD-TIME", which claims priority to U.S. Provisional Patent Application No. 62/165,695 filed on May 22, 2015, and entitled "GaN HEMT Driver with Digital Dead-Time Correction." The entireties of the aforementioned applications are hereby incorporated by reference herein.

TECHNICAL FIELD

This disclosure relates generally to a driver for a power converter.

BACKGROUND

A power converter generates an output voltage for a load based on an input voltage source. A power converter can often operate in two or more modes where each mode is associated with a switching device. During a switching operation to switch a mode of the power converter, a first switching device can be turned on and a second switching device can be turned off. An interval of time known as dead-time can also be introduced during the switching operation between the two switching devices in the power converter to account for shoot-through and reversed conduction current (e.g., a rush of current that occurs during an interval of time when the two switching devices are both powered on and a reversed current that occurs during an interval of time when the two switching devices are both powered off) and/or noise that is generated during the switching operation. Generally, a dead-time for a power converter is a fixed value. As a result, unnecessary dead-time is often added to a switching operation for a power converter.

The above-described background relating to a power converter is merely intended to provide a contextual overview of some current issues, and is not intended to be exhaustive. Other contextual information may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
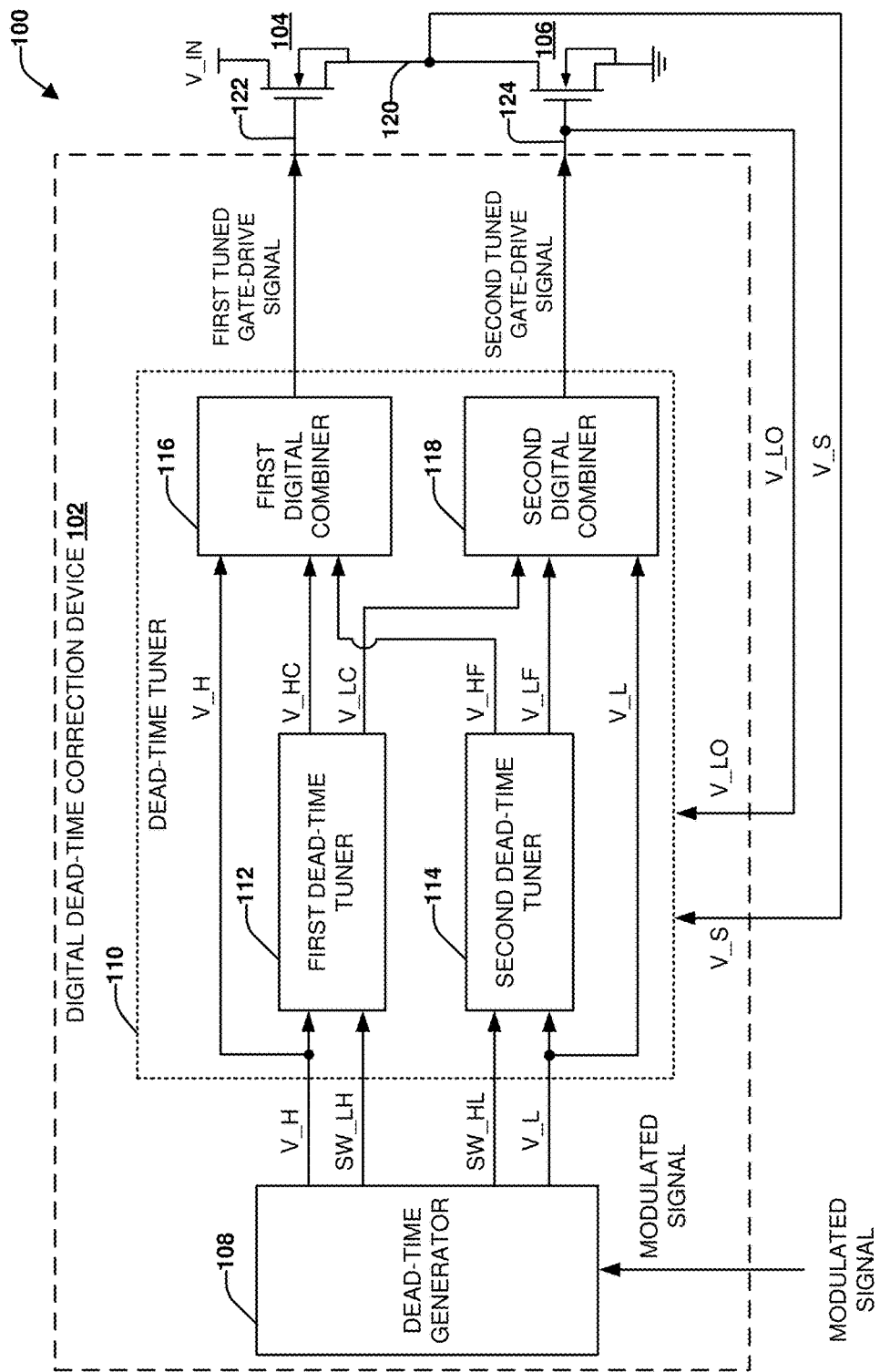
FIG. 1 presents a block diagram of an example power converter system, in accordance with one or more embodiments described herein.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of this disclosure may be practiced without these specific details, or with other methods, components, materials, etc. In other instances, well-known structures and devices are shown in block diagram form to facilitate describing the subject disclosure.

Various embodiments disclosed herein provide a tunable dead-time for a gate-drive signal that drives a switching device of a power converter. In an aspect, a device (e.g., a digital dead-time corrector) can include a dead-time generator (e.g., a fixed dead-time generator), a first dead-time tuner (e.g., a coarse dead-time corrector) and a second dead-time tuner (e.g., a fine dead-time corrector). The dead-time generator can generate a fixed dead-time between turn-on signals and turn-off signals of a first switching device (e.g., a first power transistor) and a second switching device (e.g., a second power transistor). In various embodiments, the first switching device can be a first gallium nitride (GaN) high electron mobility transistor (HEMT) and the second switching device can be a second GaN HEMT. The first dead-time tuner can reduce dead-times from the fixed dead-time value to generate tuned dead-time values (e.g., coarse dead-time values) that are smaller than the fixed dead-time value. For example, the first dead-time tuner can adjust a dead-time via a single step based on one or more feedback signals associated with the power converter (e.g., a switching node voltage associated with switching devices of the power converter and/or a gate node voltage associated with switching devices of the power converter, etc.). Furthermore, the second dead-time tuner can repeatedly reduce dead-times from the fixed dead-time value to generate other tuned dead-time values (e.g., fine dead-time values) that are smaller than the fixed dead-time value and the tuned dead-time values generated by the first dead-time tuner. The second dead-time tuner can employ a set of adjustable delay cells to facilitate generation of the fine dead-time values.

In an aspect, waveforms generated by the dead-time generator, the first dead-time tuner and/or the second dead-time tuner can be combined via a digital circuit to generate a tuned gate-drive signal. The tuned gate-drive signal can be employed to drive a switching device (e.g., a GaN HEMT) of a power converter. As such, a dead-time associated with the tuned gate-drive signal can be minimized (e.g., unnecessary dead-time for a switching device can be reduced), shoot-through current (and reversed conduction current, also known as body-diode current) associated with the power converter (e.g. performance of switching devices) can be minimized, performance of the power converter (e.g. performance of switching devices) can be improved, and/or efficiency of the power converter (e.g. efficiency of switching devices) can be improved. Furthermore, the tuned gate-drive signal can comprise a tuned dead-time that is independent of process variations, voltage variations and/or temperature variations for a power converter. The tuned gate-drive signal can also be employed to drive a switching device without undergoing further filtering after tuning the dead-time. Also, occurrence of gate breakdown associated with switching devices of a power converter and/or an amount of heat generated by a power converter can be minimized. Moreover, compared to existing predictive dead-time schemes, the various embodiments disclosed herein can achieve tuned dead-times with greater accuracy and/or by performing a fewer number of steps during a tuning process.

In an embodiment, a device includes a dead-time generator circuit, a first dead-time tuner circuit, a second dead-time tuner circuit and a digital circuit. The dead-time generator circuit can generate, based on a modulated signal, a control signal for a first switching device that is coupled to a second switching device via a switching node. The control signal can be associated with a first dead-time value indicative of an interval of time that is added to a switching operation associated with the first switching device. The first dead-time tuner circuit can generate, based on the control signal, a switching signal indicative of a first voltage associated with the switching node, and/or a gate signal indicative of a second voltage associated with a gate node for the second switching device, a first modified control signal for the first switching device. The second dead-time tuner circuit can generate, based on a modified version of the switching signal and/or a time-delayed version of the gate voltage, a tuning process that repeatedly modifies the control signal until the first dead-time value satisfies a defined criterion, a second modified control signal for the first switching device. The digital circuit can combine the control signal, the first modified control signal and the second modified control signal to generate a gate-drive control signal for the first switching device. The gate-drive control signal is associated with a second dead-time value that is less than the first dead-time value.

In another embodiment, a system includes a buffer amplifier, a dead-time generator and a dead-time tuner. The buffer amplifier can be coupled to a first transistor device and a second transistor device. The first transistor device can be coupled to the second transistor device via a switching node. The dead-time generator can generate, based on a digital signal, a gate-drive signal with a first dead-time value that is indicative of a time period added to a switching operation for the first transistor device. The dead-time tuner can include a first dead-time tuner and a second dead-time tuner. The first dead-time tuner can modify, based on a switching signal indicative of a switching voltage associated with the switching node and/or a gate signal indicative of a gate voltage associated with a gate of the second transistor device, the gate-drive signal to generate a first modified gate-drive signal. The second dead-time tuner can modify, based on a modified version of the switching signal, a time-delayed version of the gate signal and/or a tuning process that repeatedly modifies the gate-drive signal until the first dead-time value satisfies a defined criterion, the gate-drive signal to generate a second modified gate-drive signal. The gate-drive signal, the first modified gate-drive signal and the second modified gate-drive signal can be combined to generate a tuned gate-drive signal for the first transistor device. The tuned gate-drive signal can be associated with a second dead-time value that is less than the first dead-time value.

In yet another embodiment, a method includes generating, based on a pulse width modulation signal, a control signal for a first switching device that is coupled to a second switching device via a switching node. The method also includes generating, based on the control signal, a switching signal indicative of a switching voltage associated with the switching node and/or a gate signal indicative of a gate voltage associated with a gate of the second switching device, a first modified control signal for the first switching device. Furthermore, the method includes generating a second modified control signal for the first switching device by repeatedly modifying the control signal based on a modified version of the switching signal and/or a time-delayed version of the gate signal until the control signal satisfies a defined criterion. The method also includes generating a tuned control signal for the first switching device by combining the control signal, the first modified control signal and/or the second modified control signal.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

To the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Further, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

Conventional power converters have some drawbacks with respect to efficiency, performance, accuracy of a dead-time value, etc. On the other hand, various embodiments disclosed herein provide for an improved and/or tunable dead-time for a gate-drive signal that drives a switching device of a power converter. In this regard, and now referring to the drawings, FIG. 1 illustrates an example system 100 in accordance with one or more embodiments described herein. The system 100 can be, for example, a power converter system and/or a switching converter system. The system 100 can include a digital dead-time correction device 102, a first switching device 104 and a second switching device 106. The digital dead-time correction device 102 can be, for example, a digital dead-time correction circuit. In one example, the digital dead-time correction device 102 can be associated with a power system controller (e.g., a DC-DC power controller, a DC-AC power controller). In another example, the digital dead-time correction device 102 can be associated with a gate driver (e.g., half-bridge gate driver) for the first switching device 104 and/or the second switching device 106. In yet another example, the digital dead-time correction device 102 can be associated with a motor controller. The first switching device 104 and the second switching device 106 can be, for example, switching devices included in a power converter (e.g., a switching converter, a DC-DC power converter, a DC-AC power converter, a buck converter, etc.).

The digital dead-time correction device 102 can include a dead-time generator 108 and a dead-time tuner 110. The dead-time tuner 110 can include a first dead-time tuner 112 and a second dead-time tuner 114. The dead-time tuner 110 can also include a first digital combiner 116 and a second digital combiner 118. In an embodiment, the first switching device 104 and the second switching device 106 can be transistor devices. For example, the first switching device 104 can be a first GaN HEMT and the second switching device 106 can be a second GaN HEMT. The first switching device 104 and the second switching device 106 can be, for example, integrated in a GaN HEMT synchronous converter.

The dead-time generator 108 can be a fixed dead-time generator circuit that generates one or more control signals with a defined dead-time value. A dead-time value can be an interval of time that is added to a switching operation where the first switching device 104 is turned on and the second switching device 106 is turned off (or vice versa where the first switching device 104 is turned on and the second switching device 106 is turned off). For example, during a switching operation to switch a mode of a power converter, the first switching device 104 can be turned on and the second switching device 106 can be turned off (or the first switching device 104 can be turned off and the second switching device 106 can be turned on). The dead-time can be introduced for the switching operation between the first switching device 104 and the second switching device 106 to account for shoot-through current (e.g., a rush of current that occurs during an interval of time when the first switching device 104 and the second switching device 106 are both powered on) and reversed conduction currents (e.g., a reversed current that occurs during an interval of time when the first switching device 104 and the second switching device 106 are both powered off) and/or noise that is generated during the switching operation. In an aspect, the dead-time can be added to a gate-drive signal that drives the first switching device 104 and/or the second switching device 106.

In an embodiment, the dead-time generator 108 can receive a modulated signal (e.g., MODULATED SIGNAL shown in FIG. 1). The modulated signal can be a digital signal that is modulated to encode an analog signal. For example, the modulated signal can be a pulse-width modulation signal. In an aspect, the modulated signal can be generated based on an output voltage associated with the first switching device 104 and/or the second switching device 106. Based on the modulated signal, the dead-time generator 108 can generate a control signal V_H (e.g., V_H shown in FIG. 1) for the first switching device 104. Additionally or alternatively, the digital dead-time generator 102 can generate, based on the modulated signal, a control signal V_L (e.g., V_L shown in FIG. 1) for the second switching device 106. The second switching device 106 can be coupled to the first switching device 104 via a switching node 120. The switching node 120 can be a node that couples the first switching device 104 to the second switching device 106. For example, a drain of the first switching device 104 can be coupled to a source of the second switching device 106 via the switching node 104.

The control signal V_H can be a gate-drive signal capable of driving a gate node 122 for the first switching device 104. Similarly, the control signal V_L can be a gate-drive signal capable of driving a gate node 124 for the second switching device 106. The control signal V_H can be associated with a dead-time value indicative of an interval of time that is added to a switching operation associated with the first switching device 104. Furthermore, the control signal V_L can be associated with a dead-time value indicative of an interval of time that is added to a switching operation associated with the second switching device 106. The dead-time value associated with the control signal V_H can be equal to the dead-time value associated with the control signal V_L. Alternatively, the dead-time value associated with the control signal V_H can be different than the dead-time value associated with the control signal V_L. In an aspect, a source of the first switching device 104 can receive an input voltage V_IN (e.g., V_IN shown in FIG. 1). Furthermore, a drain of the second switching device 106 can be electrically grounded. Additionally, the dead-time generator 108 can generate a flag signal SW_LH (e.g., SW_LH shown in FIG. 1) and a flag signal SW_HL (e.g., SW_HL shown in FIG. 1) that indicate a voltage state of a voltage associated with the switching node 120. For example, the flag signal SW_LH and the flag signal SW_HL can indicate whether a switching signal V_S (e.g., V_S shown in FIG. 1) is switching from low to high (e.g., a turn-on dead-time) or from high to low (e.g., a turn-off dead-time). The switching signal V_S can be indicative of a voltage associated with the switching node 120 for the second switching device 106.

The dead-time tuner 110 can employ the control signal V_H, the control signal V_L, the flag signal SW_LH and/or the flag signal SW_HL to generate a first tuned gate-drive signal (e.g., FIRST TUNED GATE-DRIVE SIGNAL shown in FIG. 1) for the first switching device 104 and/or a second tuned gate-drive signal (e.g., SECOND TUNED GATE-DRIVE SIGNAL shown in FIG. 1) for the second switching device 106. Additionally, the dead-time tuner 110 can employ the switching signal V_S and/or a gate signal V_LO (e.g., V_LO shown in FIG. 1) to generate the first tuned gate—for the first switching device 104 and/or the second tuned gate-drive signal for the second switching device 106. The gate signal V_LO can be indicative of a voltage associated with the gate node 124 for the second switching device 106.

The first dead-time tuner 112 can be a first dead-time tuner circuit. The first dead-time tuner 112 can also be a coarse dead-time corrector that performs single-step tuning of the control signal V_H and/or the control signal V_L. The first dead-time tuner 112 can reduce a dead-time for the control signal V_H and/or the control signal V_C. In an aspect, the first dead-time tuner 112 can generate a modified control signal V_HC for the first switching device 104 and/or a modified control signal V_LC for the second switching device 106. The modified control signal V_HC can be a modified version of the control signal V_H and the modified control signal V_LC can be a modified version of the control signal V_L. The modified control signal V_HC can be a gate-drive signal capable of driving the gate node 122 for the first switching device 104. The first dead-time tuner 112 can compare (e.g., digitally compare) the switching signal V_S to the gate signal V_LO. Based on the comparison between the switching signal V_S and the gate signal V_LO, the first dead-time tuner 112 can modify the control signal V_H to generate the modified control signal V_HC. Similarly, the control signal V_LC can be a gate-drive signal capable of driving the gate node 124 for the second switching device 106. The first dead-time tuner 112 can generate the modified control signal V_HC based on the switching signal V_S and/or the gate signal V_LO. Furthermore, the first dead-time tuner 112 can generate the modified control signal V_LC based on the switching signal V_S and/or the gate signal V_LO. As mentioned above, the first dead-time tuner 112 can compare (e.g., digitally compare) the switching signal V_S to the gate signal V_LO. Based on the comparison between the switching signal V_S and the gate signal V_LO, the first dead-time tuner 112 can additionally or alternatively modify the control signal V_L to generate the modified control signal V_LC.

The second dead-time tuner 114 can be a second dead-time tuner circuit. The second dead-time tuner 114 can also be a fine dead-time corrector that repeatedly tunes the control signal V_H and/or the control signal V_L until a defined criterion is satisfied. The second dead-time tuner 114 can also reduce a dead-time for the control signal V_H and/or the control signal V_C. In an aspect, the second dead-time tuner 114 can generate a modified control signal V_HF for the first switching device 104 and/or a modified control signal V_LF for the second switching device 106. The modified control signal V_HF can be a modified version of the control signal V_H and the modified control signal V_LF can be a modified version of the control signal V_L. The modified control signal V_HF can be a gate-drive signal capable of driving the gate node 122 for the first switching device 104. Similarly, the control signal V_LF can be a gate-drive signal capable of driving the gate node 124 for the second switching device 106. The second dead-time tuner 114 can generate the modified control signal V_HF based on a modified version of the switching signal V_S and/or a time-delayed version of the gate signal V_LO. Additionally, the second dead-time tuner 114 can generate the modified control signal V_HF based on a tuning process (e.g., a step-by-step tuning process, a multi-step tuning process) that repeatedly modifies the control signal V_H until the control signal V_H satisfied a defined criterion. For example, the tuning process can repeatedly modify the control signal V_H during two or more tuning cycles until a dead-time value associated with the control signal V_H satisfies a defined criterion. In one example, the tuning process can repeatedly modify the control signal V_H during two or more tuning cycles until a dead-time value associated with the control signal V_H reaches a defined dead-time value.

The second dead-time tuner 114 can also generate the modified control signal V_LC based on a modified version of the switching signal V_S and/or a time-delayed version of the gate signal V_LO. Additionally, the second dead-time tuner 114 can generate the modified control signal V_LC based on a tuning process that repeatedly modifies the control signal V_L until the control signal V_L satisfied a defined criterion. For example, the tuning process can repeatedly modify the control signal V_L during two or more tuning cycles until a dead-time value associated with the control signal V_L satisfies a defined criterion. In one example, the tuning process can repeatedly modify the control signal V_L during two or more tuning cycles until a dead-time value associated with the control signal V_L reaches a defined dead-time value. A tuning process for the control signal V_H can correspond to a tuning process for the control signal V_C. Alternatively, a tuning process for the control signal V_H can be different than a tuning process for the control signal V_C The first digital combiner 116 can be a digital circuit that combines the control signal V_H generated by the dead-time generator 108, the modified control signal V_HC generated by the first dead-time tuner 112 and/or the modified control signal V_HF generated by the second dead-time tuner 114. By combining the control signal V_H, the modified control signal V_HC and/or the modified control signal V_HF, the first digital combiner 116 can generate the first tuned gate-drive signal to drive a gate of the first switching device 104. In one example, the first digital combiner 116 can be an AND logic gate. In an aspect, the first digital combiner 116 can combine a first waveform associated with the control signal V_H, a second waveform associated with the modified control signal V_HC and/or a third waveform associated with the modified control signal V_HF. Therefore, the first tuned gate-drive signal generated by the first digital combiner 116 can correspond to a combined gate-drive signal associated with the control signal V_H, the modified control signal V_HC and/or the modified control signal V_HF. A dead-time value for the first tuned gate-drive signal can be less than a dead-time value for the control signal V_H, the modified control signal V_HC and/or the modified control signal V_HF. In a non-limiting example, a dead-time value for the first tuned gate-drive signal can be approximately two nanoseconds.

Additionally, the second digital combiner 118 can be a digital circuit that combines the control signal V_L generated by the dead-time generator 108, the modified control signal V_LC generated by the first dead-time tuner 112 and/or the modified control signal V_LF generated by the second dead-time tuner 114. By combining the control signal V_L, the modified control signal V_LC and/or the modified control signal V_LF, the second digital combiner 118 can generate the second tuned gate-drive signal to drive a gate of the second switching device 106. In one example, the second digital combiner 118 can be an AND logic gate. In an aspect, the second digital combiner 118 can combine a first waveform associated with the control signal V_L, a second waveform associated with the modified control signal V_LC and/or a third waveform associated with the modified control signal V_LF. Therefore, the second tuned gate-drive signal generated by the second digital combiner 118 can correspond to a combined gate-drive signal associated with the control signal V_L, the modified control signal V_LC and/or the modified control signal V_LF. A dead-time value for the second tuned gate-drive signal can be less than a dead-time value for the control signal V_L, the modified control signal V_LC and/or the modified control signal V_LF. In a non-limiting example, a dead-time value for the second tuned gate-drive signal can be approximately two nanoseconds. In an aspect, the first digital combiner 116 and/or the second digital combiner 118 can be implemented as a buffer amplifier.

Figure 2:
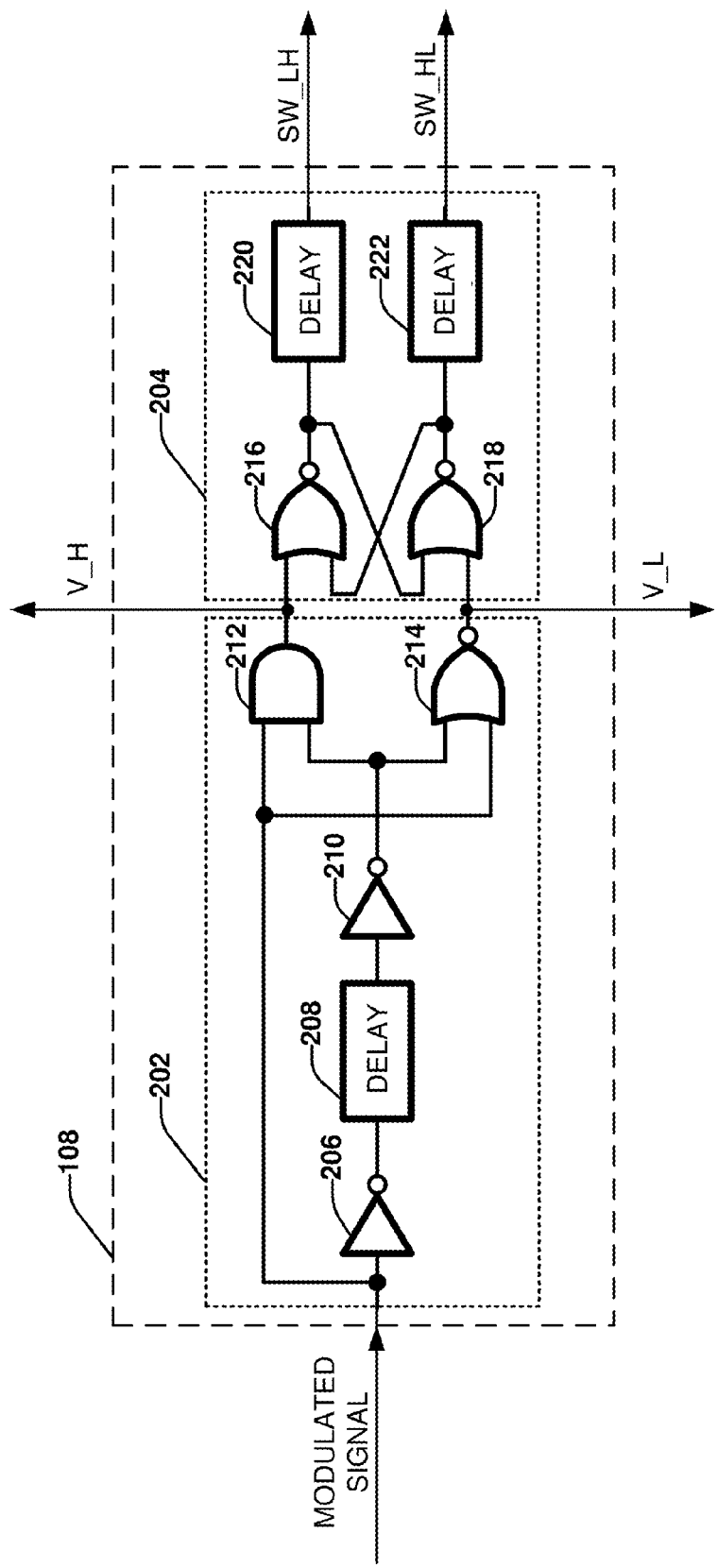
FIG. 2 presents an example dead-time generator, in accordance with one or more embodiments described herein.

FIG. 2 illustrates the dead-time generator 108 in accordance with one or more embodiments described herein. The dead-time generator 108 can include a dead-time generation stage 202 and a flag generation stage 204. The dead-time generation stage 202 can generate the control signal V_H and the control signal V_L based on dead-time processing for the modulated signal. The dead-time generation stage 202 can include an inverter 206, a delay stage 208, an inverter 210, an AND logic gate 212 and a NOR logic gate 214. The inverter 206 can receive the modulated signal and generate a voltage signal associated with opposite logics state than the modulated signal. The delay stage 208 can add a defined amount of delay (e.g., a fixed dead-time) to the voltage signal provided by the inverter 206. The inverter 210 can invert the voltage signal provided by the inverter 206 to provide a modified version of the modulated signal with the defined amount of delay.

Based on the modulated signal and the modified version of the modulated signal with the defined amount of delay, the AND logic gate 212 can provide the control signal V_H. Furthermore, based on the modulated signal and the modified version of the modulated signal with the defined amount of delay, the NOR logic gate 214 can provide the control signal V_H. The flag generation stage 204 can include a NOR logic gate 216, a NOR logic gate 218, a delay stage 220 and a delay stage 222. The NOR logic gate 216 can facilitate generation of the flag signal SW_LH based on the control signal V_H and output generated by the NOR logic gate 218. Furthermore, the NOR logic gate 218 can facilitate generation of the flag signal SW_HL based on the control signal V_L and output generated by the NOR logic gate 216. In an aspect, a defined amount of delay can be added to the flag signal SW_LH via the delay stage 220 and a defined amount of delay can be added to the flag signal SW_HL via the delay stage 222. The defined amount of delay added to the flag signal SW_LH via the delay stage 220 can be equal to the defined amount of delay added to the flag signal SW_HL via the delay stage 222. Alternatively, the defined amount of delay added to the flag signal SW_LH via the delay stage 220 can be different than the defined amount of delay added to the flag signal SW_HL via the delay stage 222. In another aspect, the NOR logic gate 216 and the NOR logic gate 218 can form a latch circuit that stores state information associated with the control signal V_H and the control signal V_L.

Figure 3:
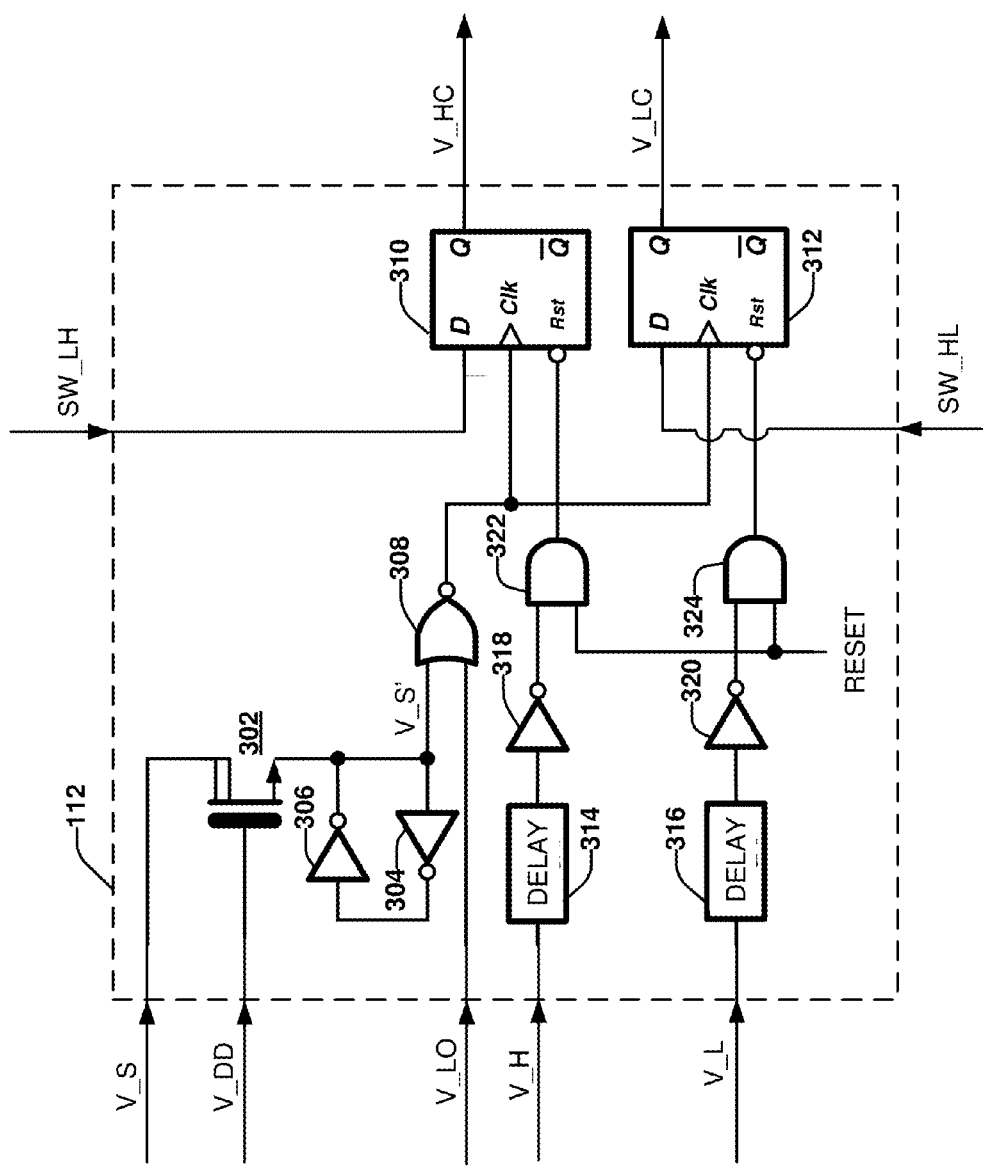
FIG. 3 presents an example first dead-time tuner, in accordance with one or more embodiments described herein.

FIG. 3 illustrates the first dead-time tuner 112 in accordance with one or more embodiments described herein. The first dead-time tuner 112 can provide a single-step tuning process based on the switching signal V_S and/or the gate signal V_LO to facilitate reducing of a dead-time value for the control signal V_H and/or the control signal V_L. The first dead-time tuner 112 can generate the modified control signal V_HC and the modified control signal V_LC based on the control signal V_H, the control signal V_L, the flag signal SW_LH, the flag signal SW_HL, the switching signal V_S, the gate signal V_LO and/or a power supply signal V_DD. The power supply signal V_DD can be indicative of a voltage provided to an integrated circuit that includes the digital dead-time correction device 102. The first dead-time tuner 112 can include a laterally diffused metal oxide semiconductor (LDMOS) 302. The LDMOS 302 can translate the switching signal V_S into a modified switching voltage signal V_S'. The modified switching voltage signal V_S' can be a modified version of the switching voltage V_S. For example, a voltage level of the modified switching voltage signal V_S' can be lower than a voltage level of the switching voltage signal V_S. In an aspect, a defined amount of delay can be added to the modified switching voltage signal V_S' via an inverter 304 and an inverter 306. The inverter 304 can the inverter 306 can be implemented as an inverter latch. A NOR logic gate 308 can receive the modified switching signal V_S' and the gate signal V_LO. The NOR logic gate 308 can provide clock input to a first flip-flop device 310 and a second flip-flop device 312. The first flip-flop device 310 and the second flip-flop device 312 can be, for example, D flip-flop devices. The flag signal SW_LH can provide data input to the first flip-flop device 310 and the flag signal SW_HL can provide data input to the second flip-flop device 312.

The first flip-flop device 310 can generate the modified control signal V_HC based on the clock input provided by the NOR logic gate 308 and the flag signal SW_LH. For example, when the modified switching signal V_S' and the gate signal V_LO are both equal to 0V, output of the NOR logic gate 308 can be equal to a logical value of "1" and the first flip-flop device 310 can be triggered to generate the modified control signal V_HC. Similarly, when the modified switching signal V_S' and the gate signal V_LO are both equal to 0V, output of the NOR logic gate 308 can be equal to a logical value of "1" and the second flip-flop device 312 can be triggered to generate the modified control signal V_LC. The first dead-time tuner 112 can also include a delay stage 314 that adds a defined amount of delay to the control signal V_H and a delay stage 316 that adds a defined amount of delay to the control signal V_L. The control signal V_H with the defined amount of delay can be received by an inverter 318 and the control signal V_L with the defined amount of delay can be received by an inverter 320. Output from the inverter 318 and a reset command can be received by an AND logic gate 322. Furthermore, output from the inverter 320 and a reset command can be received by an AND logic gate 324. The AND logic gate 322 can reset the first flip-flop device 310 based on the control signal V_H and the AND logic gate 324 can reset the second flip-flop device 312 based on the control signal V_L. For example, once the control signal V_H is received by the first flip-flop device 310 after the amount of delay determined by the delay stage 314, the first flip-flop device 310 can be reset. Furthermore, once the control signal V_L is received by the second flip-flop device 312 after the amount of delay determined by the delay stage 316, the second flip-flop device 312 can be reset.

In an example, when the gate signal V_LO is equal to zero and the modified switching voltage signal V_S' is equal to zero, output of the NOR logic gate 308 can trigger the first flip-flop device 310 and the second flip-flop device 312. In a non-limiting example when the flag signal SW_LH is equal to a logical value of "1" and the flag signal SW_HL is equal to a logical value of "0", output of the NOR logic gate 308 can trigger the first flip-flop device 310. Furthermore, when the flag signal SW_LH is equal to a logical value of "1" and the flag signal SW_HL is equal to a logical value of "0", the modified control signal V_HC can switch from a logical value equal to "0" to a logical value equal to "1". As such, the modified control signal V_HC can be provided to the first switching device 104 at an earlier instance in time to shorten dead-time. After a defined amount of delay determined by the delay stage 314, the control signal V_H can reduce the flag signal SW_LH to a logical value equal to "0" to prepare for a next triggering stage. Also, after a defined amount of delay, the control signal V_HC can return to a logical value equal to "0" that is triggered by output provided by the AND logic gate 322.

Similarly, when the flag signal SW_LH is equal to a logical value "0" and the flag signal SW_HL is equal to a logical value "1", output of the NOR logic gate 308 can trigger the flip-flop device 312. Furthermore, when the flag signal SW_LH is equal to a logical value "0" and the flag signal SW_HL is equal to a logical value "1", the modified control signal V_LC can switch from a logical value equal to "0" to a logical value equal to "1". As such, the modified control signal V_LC can be provided to the second switching device 106 at an earlier instance in time to shorten dead-time. After a defined amount of delay determined by the delay stage 316, the control signal V_L can modify the flag signal SW_LH to a logical value equal to "1". Also, after a defined amount of delay, the control signal V_LC can return to a logical value equal to "0" that is triggered by output provided by the AND logic gate 324. Accordingly, the first dead-time tuner 112 can provide single step tuning by sensing the switching signal V_S and/or the gate signal V_LO. Moreover, a dead-time for the control signal V_H and/or the control signal V_L can be reduced.

Figure 4:
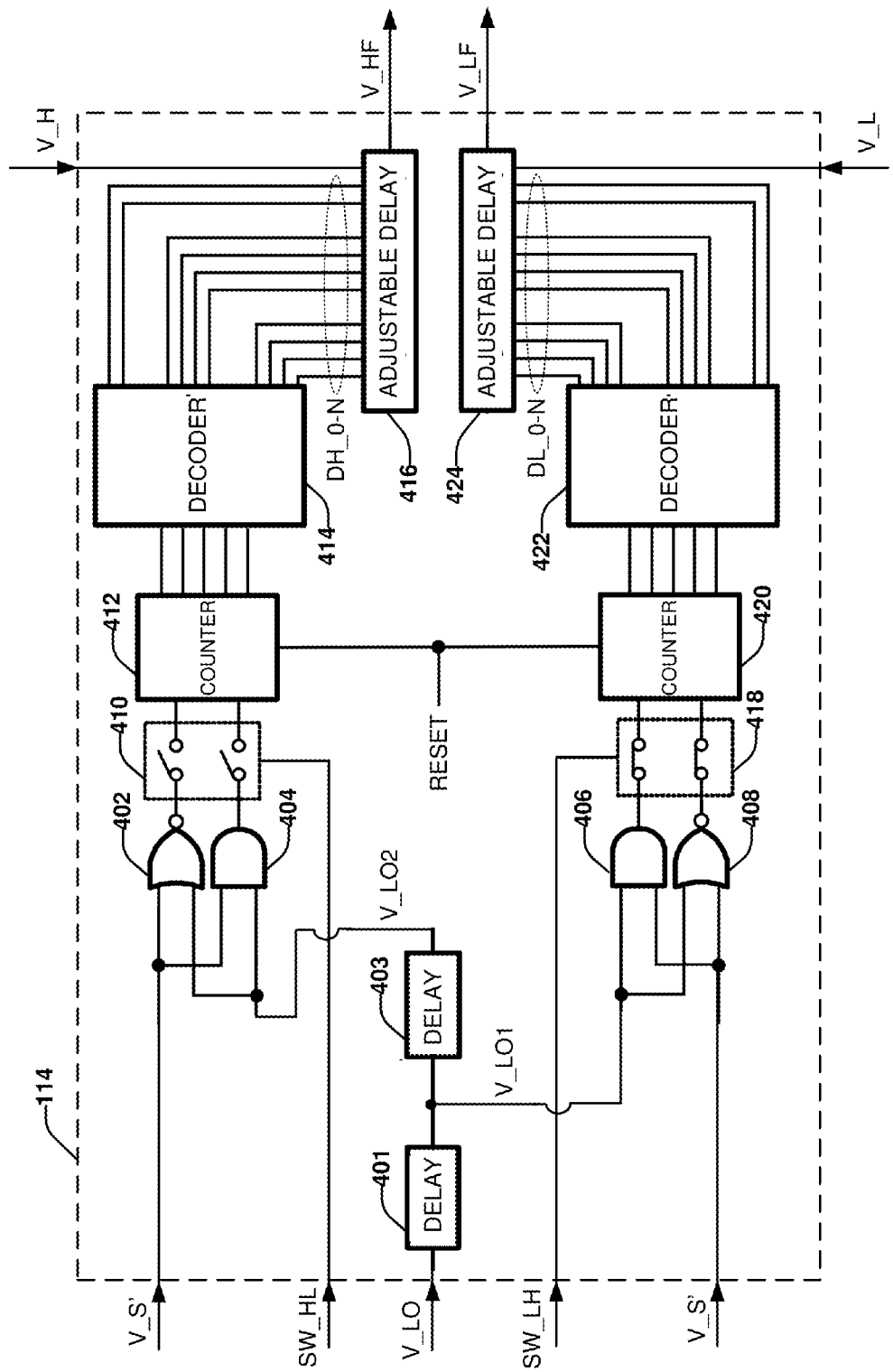
FIG. 4 presents an example second dead-time tuner, in accordance with one or more embodiments described herein.

FIG. 4 illustrates the second dead-time tuner 114 in accordance with one or more embodiments described herein. The second dead-time tuner 114 can be a tunable digital delay system. The second dead-time tuner 114 can provide a step-by step tuning process (e.g., a multi-step tuning process) based on the switching signal V_S and/or the gate signal V_LO to facilitate reducing of a dead-time value for the control signal V_H and/or the control signal V_L. The second dead-time tuner 114 can generate the modified control signal V_HF and the modified control signal V_LF based on the control signal V_H, the control signal V_L, the flag signal SW_LH, the flag signal SW_HL, the modified switching signal V_S' and/or the gate signal V_LO.

The second dead-time tuner 114 can include a NOR logic gate 402, an AND logic gate 404, a NOR logic gate 406 and an AND logic gate 408. The second dead-time tuner 114 can also include a delay stage 401 and a delay stage 403. The delay stage 401 can generate a first delayed gate signal V_LO1 (e.g., V_LO1 shown in FIG. 4) and the delay stage 403 can generate a second delayed gate signal V_LO2 (e.g., V_LO2 shown in FIG. 4). The first delayed gate signal V_LO1 can be a delayed version of the gate signal V_LO. Furthermore, the second delayed gate signal V_LO2 can be a delayed version of the first delayed gate signal V_LO1. Therefore, the second delayed gate signal V_LO2 can be associated with a greater amount of delay than the first delayed gate signal V_LO1. In an aspect, the first delayed gate signal V_LO1 and the second delayed gate signal V_LO2 can set marginal dead-times to minimize likelihood of shoot-through current associated with the first switching device 104 and/or the second switching device 106.

The NOR logic gate 402 can receive the modified switching signal V_S' and the second delayed gate signal V_LO2. Furthermore, the AND logic gate 404 can also receive the modified switching signal V_S' and the second delayed gate signal V_LO2. Output from the NOR logic gate 402 and the AND logic gate 404 can control a set of switches 410 coupled to a counter 412. The counter 412 can be a bi-directional counter (e.g., a 5-bit bi-directional counter). The counter 412 can also be coupled to a decoder 414. Furthermore, the decoder 414 can be coupled to an adjustable delay stage 416. The adjustable delay stage 416 can receive the control signal V_H and a set of decoded signals DH_0-N (e.g., DH_0-N shown in FIG. 4). A value of the set of decoded signals DH_0-N can determine an amount of delay added to the control signal V_H. The adjustable delay stage 416 can generate the modified control signal V_HF based on the set of decoded signals DH_0-N and the control signal V_H. Based on trigger pulses from the NOR logic gate 402 and the AND logic gate 404, the control signal V_H can be modified N unit-times via the adjustable delay stage 416. For example, the set of decoded signal DH_0-N can facilitate increasing or decreasing a delay time-unit for the control signal V_H by one unit-time.

Additionally, the AND logic gate 406 can receive the modified switching signal V_S' and the first delayed gate signal V_LO1. Furthermore, the NOR logic gate 408 can also receive the modified switching signal V_S' and the first delayed gate signal V_LO1. Output from the AND logic gate 406 and the NOR logic gate 408 can control a set of switches 418 coupled to a counter 420. The counter 420 can be a bi-directional counter (e.g., a 5-bit bi-directional counter). The counter 420 can also be coupled to a decoder 422. Furthermore, the decoder 422 can be coupled to an adjustable delay stage 424. The adjustable delay stage 424 can receive the control signal V_L and a set of decoded signals DL_0-N (e.g., DL_0-N shown in FIG. 4). A value of the set of decoded signals DL_0-N can determine an amount of delay added to the control signal V_L. The adjustable delay stage 424 can generate the modified control signal V_LF based on the set of decoded signals DL_0-N and the control signal V_L. Based on trigger pulses from the AND logic gate 406 and the NOR logic gate 408, the control signal V_L can be delayed N unit-times via the adjustable delay stage 424. For example, the set of decoded signal DL_0-N can facilitate increasing or decreasing a delay for the control signal V_L by one unit-time. In an aspect, the NOR logic gate 402, the AND logic gate 404, the AND logic gate 406 and/or the NOR logic gate 408 can simultaneously sense the first delayed gate signal V_LO1, the second delayed gate signal V_LO2 and/or the modified switching signal V_S'.

In an example, if the flag signal SW_HL is equal to a logical value of "1" and dead-time is equal to a certain dead-time level, the NOR logic gate 402 can send a pulse signal to the counter 412. Output of the counter 412 can increase by a single unit and adjustable delay between the control signal V_H and the modified control signal V_HF can be increased (e.g., using the adjustable delay stage 416) by a single delay time unit. As a result, dead-time of the modified control signal V_HF can periodically decrease by a single delay time unit until the pulse signal provided by the NOR logic gate 402 becomes 0. If the dead-time is not equal to a certain dead-time value, the AND logic gate 404 can send a pulse signal to the counter 412. Output of the counter 412 can decrease by a single unit and adjustable delay between the control signal V_H and the modified control signal V_HF can be increased (e.g., using the adjustable delay stage 416 during multiple tuning cycles) by a single delay time unit until the pulse signal provided by the AND logic gate 404 becomes 0.

Similarly, in an example where the flag signal SW_HL is equal to a logical value of "1" and dead-time is equal to a certain dead-time level, the NOR logic gate 408 can send a pulse signal to the counter 420. Output of the counter 420 can increase by a single unit and adjustable delay between the control signal V_L and the modified control signal V_LF can be increased (e.g., using the adjustable delay stage 424) by a single delay time unit. As a result, dead-time of the modified control signal V_LF can periodically decrease by a single delay time unit until the pulse signal provided by the NOR logic gate 408 becomes 0. If the dead-time is not equal to a certain dead-time value, the AND logic gate 406 can send a pulse signal to the counter 420. Output of the counter 420 can decrease by a single unit and adjustable delay between the control signal V_L and the modified control signal V_LF can be increased (e.g., using the adjustable delay stage 424 during multiple tuning cycles) by a single delay time unit until the pulse signal provided by the AND logic gate 406 becomes 0.

Figure 5:
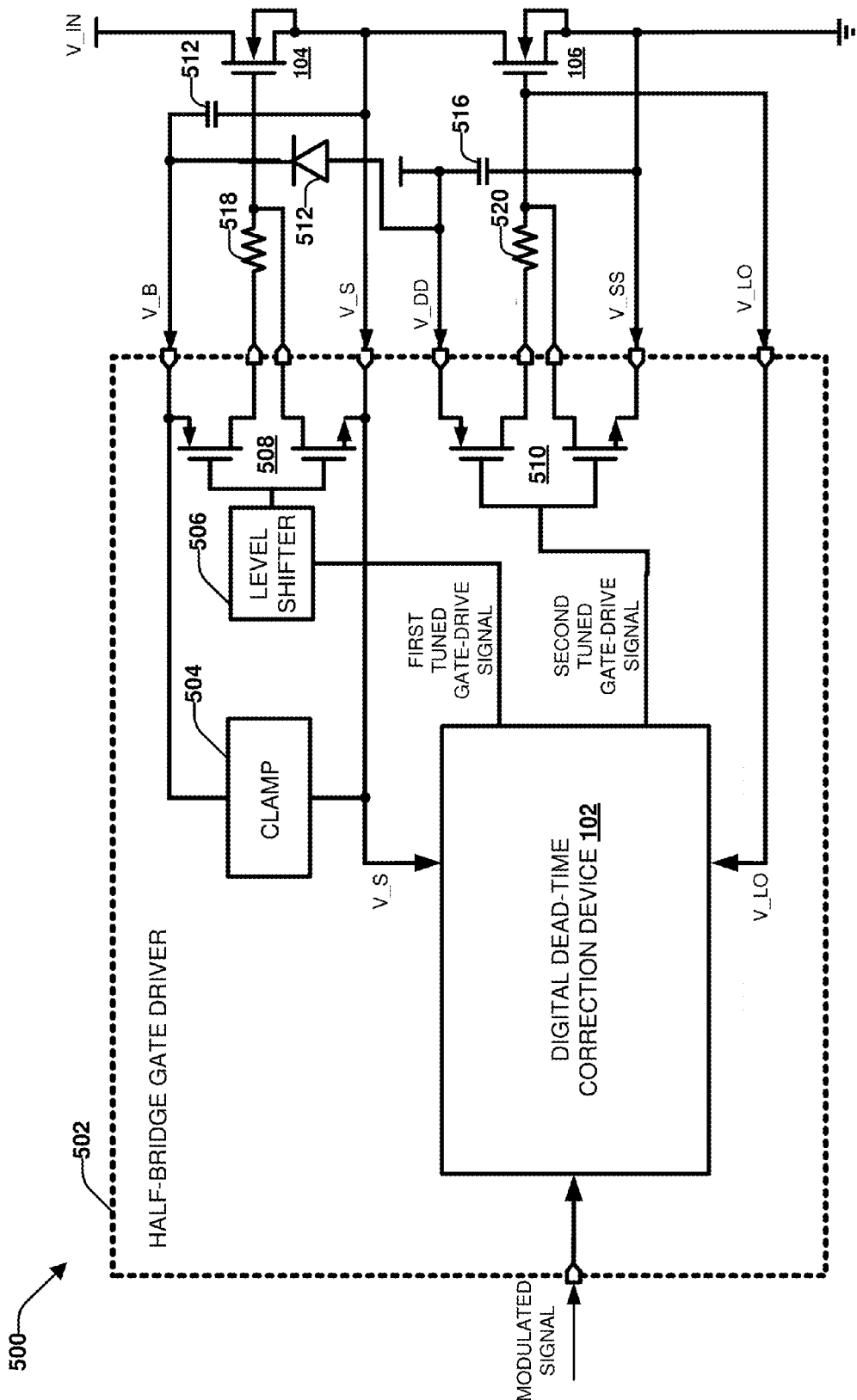
FIG. 5 presents a block diagram of another example power converter system, in accordance with one or more embodiments described herein.

Referring now to FIG. 5, illustrated is an example system 500 in accordance with one or more embodiments described herein. The system 500 can include a half-bridge gate driver 502, the first switching device 104 and the second switching device 106. The half-bridge gate driver 502 can include the digital dead-time correction device 102, a clamp 504, a level shifter 506, a first buffer stage 508 and a second buffer stage 510. The digital dead-time correction device 102 can include the dead-time generator 108, the dead-time tuner 110, the first dead-time tuner 112, the second dead-time tuner 114, the first digital combiner 116 and/or the second digital combiner 118. In one example, the half-bridge gate driver 502 can be a GaN HEMT half-bridge gate driver.

The digital dead-time correction device 102 can employ the switching signal V_S and/or the gate signal V_LO to adjust and/or tune a dead-time value provided by the half-bridge gate driver 502 for the first switching device 104 and/or the second switching device 106. The digital dead-time correction device 102 can generate the first tuned gate-drive signal for the first switching device 104 based on the modulated signal, the switching signal V_S and/or the gate signal V_LO. Furthermore, the digital dead-time correction device 102 can generate the second tuned gate-drive signal for the second switching device 106 based on the modulated signal, the switching signal V_S and/or the gate signal V_LO. The first tuned gate-drive signal generated by the digital dead-time correction device 102 can be provided to the first buffer stage 508 for the first switching device 104. In an aspect, the voltage of the first tuned gate-drive signal can be translated by the level shifter 506 before being received by the first buffer stage 508. For example, the level shifter 506 can modifying a voltage level of the first tuned gate-drive signal and/or can provide the first tuned gate-drive signal with the modified voltage level to the first buffer stage 508. The first buffer stage 508 can comprises a set of transistors (e.g., a set of MOSFETs). The second tuned gate-drive signal generated by the digital dead-time correction device 102 can be provided to the second buffer stage 510 for the first switching device 106. The second buffer stage 510 can comprises a set of transistors (e.g., a set of MOSFETs). The first buffer stage 508 can transmit the first tuned gate-drive signal to the first switching device 104. Furthermore, the second buffer stage 510 can transmit the second tuned gate-drive signal to the second switching device 106. For example, the first buffer stage 508 can drive the first switching device 104 via the first tuned gate-drive signal and the second buffer stage 510 can drive the second switching device 106 via the second tuned gate-drive signal.

In an embodiment, a processed signal V_B can be added to the switching signal V_S before being received by the digital dead-time correction device 102. For example, the switching signal V_S can be processed by a capacitor 512 to generate the processed signal V_B. Additionally or alternatively, the switching signal V_S can be processed by a diode 514. The processed signal V_B can be a processed version of the switching signal V_S. Furthermore, the processed signal V_B can comprise a lower amount of noise (e.g., a lower amount of high frequency noise) than the switching signal V_S. Before being added to the switching signal V_S, the processed signal V_B can be processed by the clamp 504. The clamp 504 can, for example, translate a waveform of the processed signal V_B to adapt the processed signal V_B and/or the switching signal V_S to the digital dead-time correction device 102. In an aspect, a power supply signal V_SS can be formed by processing the power supply signal V_DD via a capacitor 516. In one example, the power supply signal V_DD can be a positive power supply and the power supply signal V_SS can be a negative power supply. The power supply signal V_DD and the power supply signal V_SS can be provided to the second buffer stage 510. In certain embodiments, a resistor 518 can be employed to reduce current and/or voltage of the first tuned gate-drive signal provided to the first switching device 104. Furthermore, a resistor 520 can be employed to reduce current and/or voltage of the second tuned gate-drive signal provided to the second switching device 106.

Figure 6:
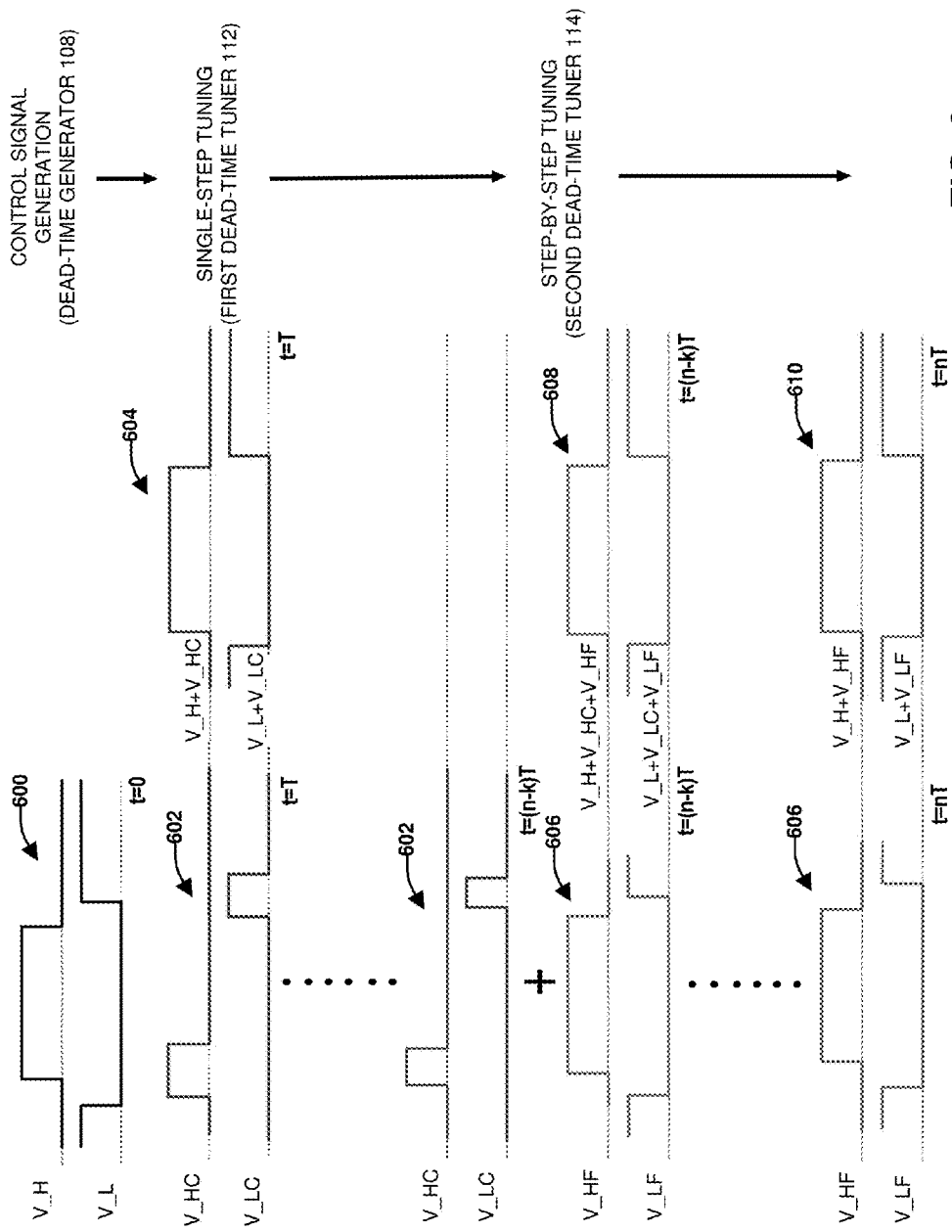
FIG. 6 presents example timing diagrams associated a digital dead-time correction device, in accordance with one or more embodiments described herein.

Referring now to FIG. 6, illustrated are various example timing diagrams in accordance with one or more embodiments described herein. A timing diagram 600 illustrates an example control signal V_H and an example control signal V_L generated by the dead-time generator 108. A timing diagram 602 illustrates an example modified control signal V_HC and an example modified control signal V_LC generated by the first dead-time tuner 112. In an embodiment, the first tuned gate-drive signal provided by the dead-time tuner 110 can be generated based on the control signal V_H and the modified control signal V_HC. Furthermore, the second tuned gate-drive signal provided by the dead-time tuner 110 can be generated based on the control signal V_L and the modified control signal V_LC. A timing diagram 604 illustrates an example first tuned gate-drive signal generated by combining the control signal V_H shown in the timing diagram 600 and the modified control signal V_HC shown in the timing diagram 602. Furthermore, timing diagram 604 illustrates an example second tuned gate-drive signal generated by combining the control signal V_L shown in the timing diagram 600 and the modified control signal V_LC shown in the timing diagram 602. The example first tuned gate-drive signal shown in the timing diagram 604 can comprise a lower dead-time value than the example control signal V_H shown in the timing diagram 600. Furthermore, the example second tuned gate-drive signal shown in the timing diagram 604 can comprise a lower dead-time value than the example control signal V_L shown in the timing diagram 600.

A timing diagram 606 illustrates an example modified control signal V_HF and an example modified control signal V_LF generated by the first dead-time tuner 112. In an embodiment, the first tuned gate-drive signal provided by the dead-time tuner 110 can be generated based on the control signal V_H, the modified control signal V_HC, and the modified control signal V_HF. Furthermore, the second tuned gate-drive signal provided by the dead-time tuner 110 can be generated based on the control signal V_L, the modified control signal V_LC, and the modified control signal V_LF. A timing diagram 608 illustrates an example first tuned gate-drive signal generated by combining the control signal V_H shown in the timing diagram 600, the modified control signal V_HC shown in the timing diagram 602, and the modified control signal V_HF shown in the timing diagram 606. Furthermore, timing diagram 608 illustrates an example second tuned gate-drive signal generated by combining the control signal V_L shown in the timing diagram 600, the modified control signal V_LC shown in the timing diagram 602, and the modified control signal V_LF shown in the timing diagram 606. The example first tuned gate-drive signal shown in the timing diagram 608 can comprise a lower dead-time value than the example control signal V_H shown in the timing diagram 600. Furthermore, the example second tuned gate-drive signal shown in the timing diagram 608 can comprise a lower dead-time value than the example control signal V_L shown in the timing diagram 600.

In an embodiment, the first tuned gate-drive signal provided by the dead-time tuner 110 can be generated based on the control signal V_H and the modified control signal V_HF. Furthermore, the second tuned gate-drive signal provided by the dead-time tuner 110 can be generated based on the control signal V_L and the modified control signal V_LF. A timing diagram 610 illustrates an example first tuned gate-drive signal generated by combining the control signal V_H shown in the timing diagram 600 and the modified control signal V_HF shown in the timing diagram 606. Furthermore, timing diagram 610 illustrates an example second tuned gate-drive signal generated by combining the control signal V_L shown in the timing diagram 600 and the modified control signal V_LF shown in the timing diagram 606. The example first tuned gate-drive signal shown in the timing diagram 610 can comprise a lower dead-time value than the example control signal V_H shown in the timing diagram 600. Furthermore, the example second tuned gate-drive signal shown in the timing diagram 610 can comprise a lower dead-time value than the example control signal V_L shown in the timing diagram 600.

Figure 7:
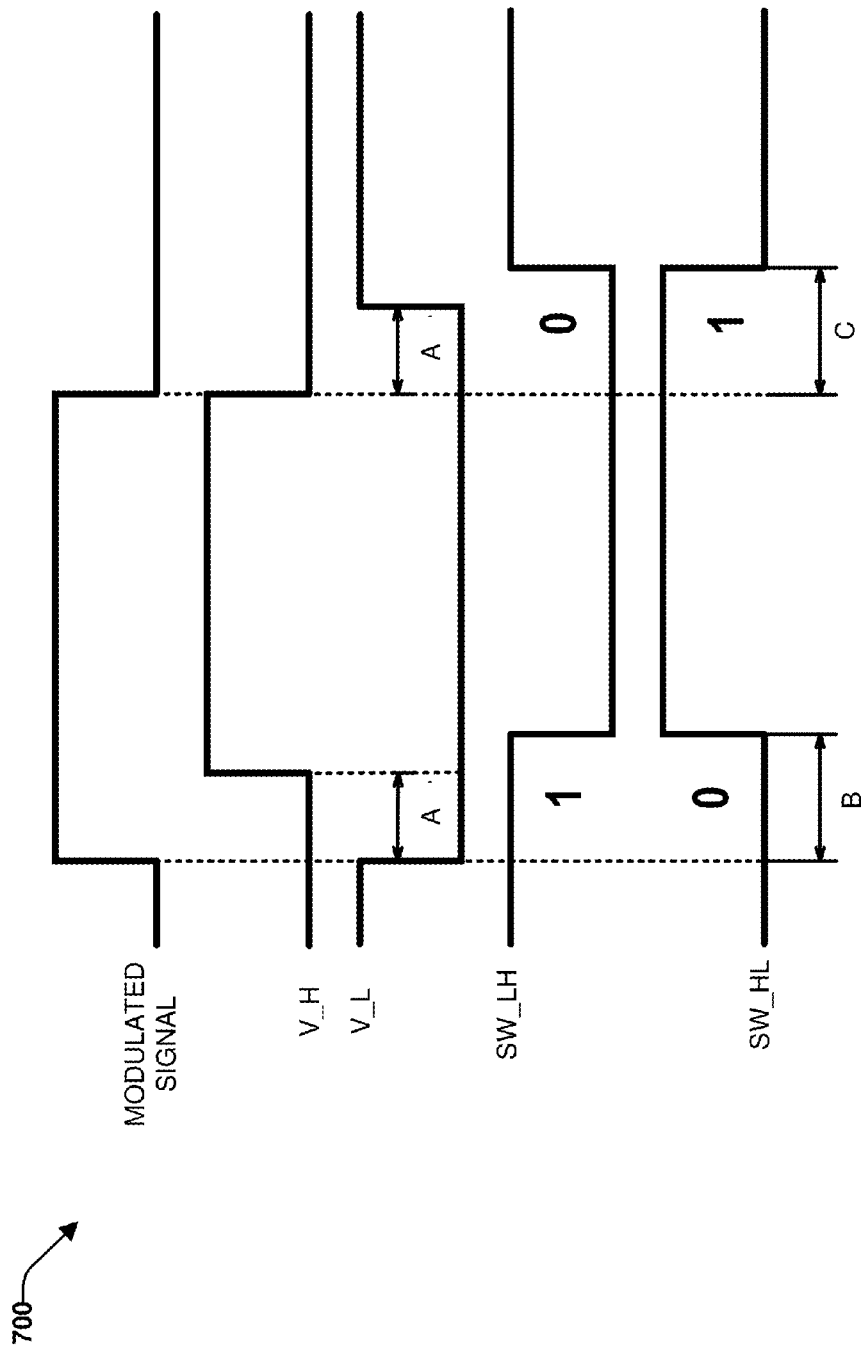
FIG. 7 presents an example timing diagram associated a dead-time generator, in accordance with one or more embodiments described herein.

Referring to FIG. 7, illustrated is example timing diagram 700 in accordance with one or more embodiments described herein. The timing diagram 700 can be associated with the dead-time generator 108. The timing diagram 700 illustrates an example modulated signal received by the dead-time generator 108, an example control signal V_H generated by the dead-time generator 108, and an example control signal V_L generated by the dead-time generator 108. As shown in the timing diagram 700, a width of a pulse for the control signal V_H can be reduced by an amount of time A with respect to the modulated signal. Furthermore, a width of a pulse for the control signal V_L can be increased by an amount of time A with respect to the modulated signal. The amount of time A can be determined by the delay stage 208 of the dead-time generator 108. The timing diagram 700 also illustrates an example flag signal SW_LH generated by the dead-time generator 108 and an example flag signal SW_HL generated by the dead-time generator 108. As shown in the timing diagram 700, a binary value "1" for the flag signal SW_LH can be determined based on an amount of time B. Furthermore, a binary value "1" for the flag signal SW_HL can be determined based on an amount of time C. The amount of time B can be determined by the delay stage 208 of the dead-time generator 108 and the delay stage 220 of the dead-time generator 108. For example, the amount of time B can be determined by adding a time value provided by the delay stage 208 and another time value provided by the delay stage 220. The amount of time C can be determined by the delay stage 208 of the dead-time generator 108 and the delay stage 222 of the dead-time generator 108. For example, the amount of time B can be determined by adding a time value provided by the delay stage 208 and another time value provided by the delay stage 222.

Figure 8:
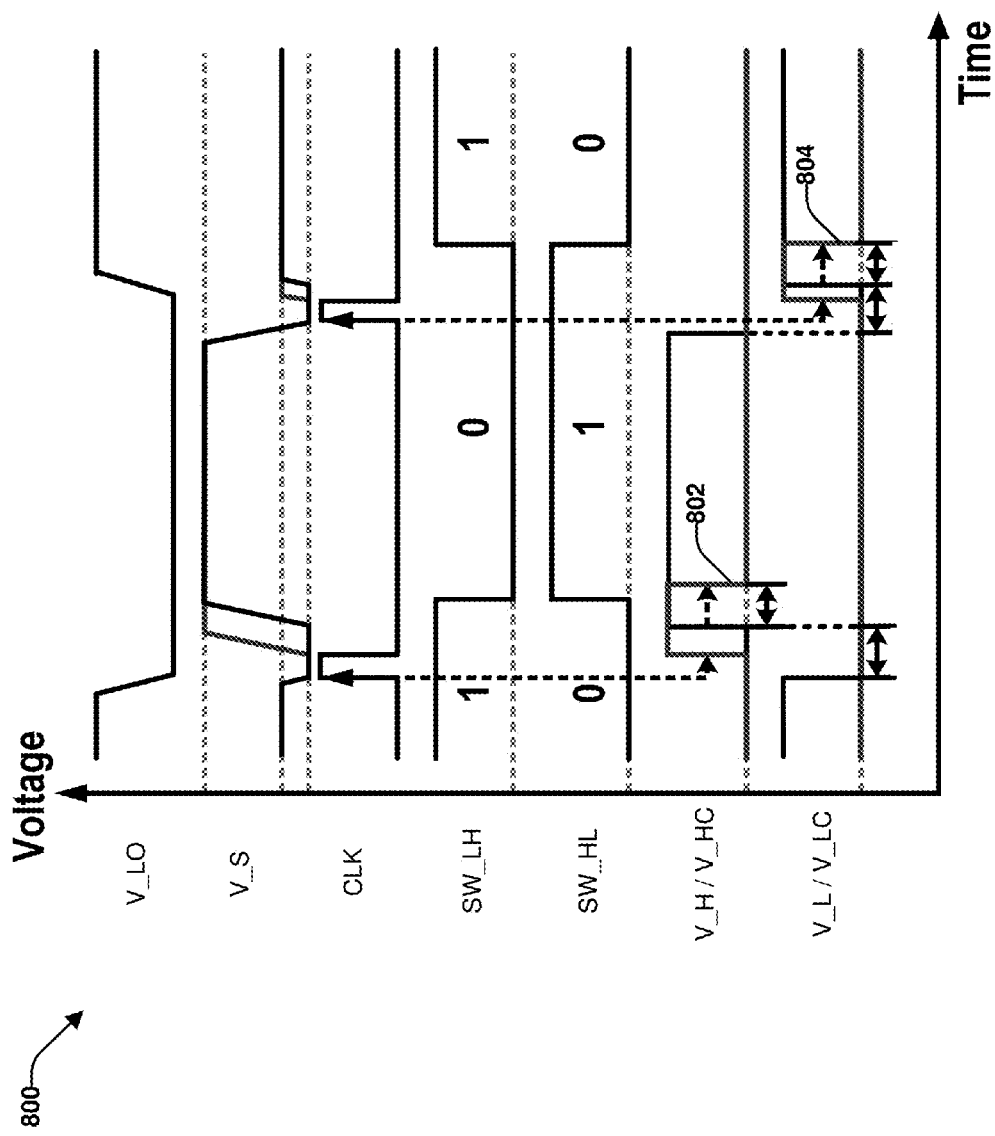
FIG. 8 presents an example timing diagram associated a first dead-time tuner, in accordance with one or more embodiments described herein.

Referring to FIG. 8, illustrated is example timing diagram 800 in accordance with one or more embodiments described herein. The timing diagram 800 can be associated with the first dead-time tuner 112. The timing diagram 800 illustrates an example gate signal V_LO received by the first dead-time tuner 112, an example switching signal V_S received by the first dead-time tuner 112, an example clock signal CLK received by the first flip-flop device 310 and/or the second flip-flop device 312 of the first dead-time tuner 112, an example flag signal SW_LH received by the first dead-time tuner 112, and an example flag signal SW_HL received by the first dead-time tuner 112. The timing diagram 800 also illustrates an example control signal V_H received by the first dead-time tuner 112, an example control signal V_HC generated by the first dead-time tuner 112, an example control signal V_L received by the first dead-time tuner 112, and an example control signal V_LC generated by the first dead-time tuner 112. As shown by a voltage waveform 802 associated with the modified control signal V_HC, a dead-time value of the modified control signal V_HC can tuned with respect to the control signal V_H via a single-step tuning process associated with the first dead-time tuner 112. For example, a dead-time value of the modified control signal V_HC can be greater than or less than a dead-time value of the control signal V_H. Furthermore, as shown by a voltage waveform 804 associated with the modified control signal V_LC, a dead-time value of the modified control signal V_HL can be tuned with respect to the control signal V_L via a single-step tuning process associated with the first dead-time tuner 112. For example, a dead-time value of the modified control signal V_LC can be greater than or less than a dead-time value of the control signal V_L.

Figure 9:
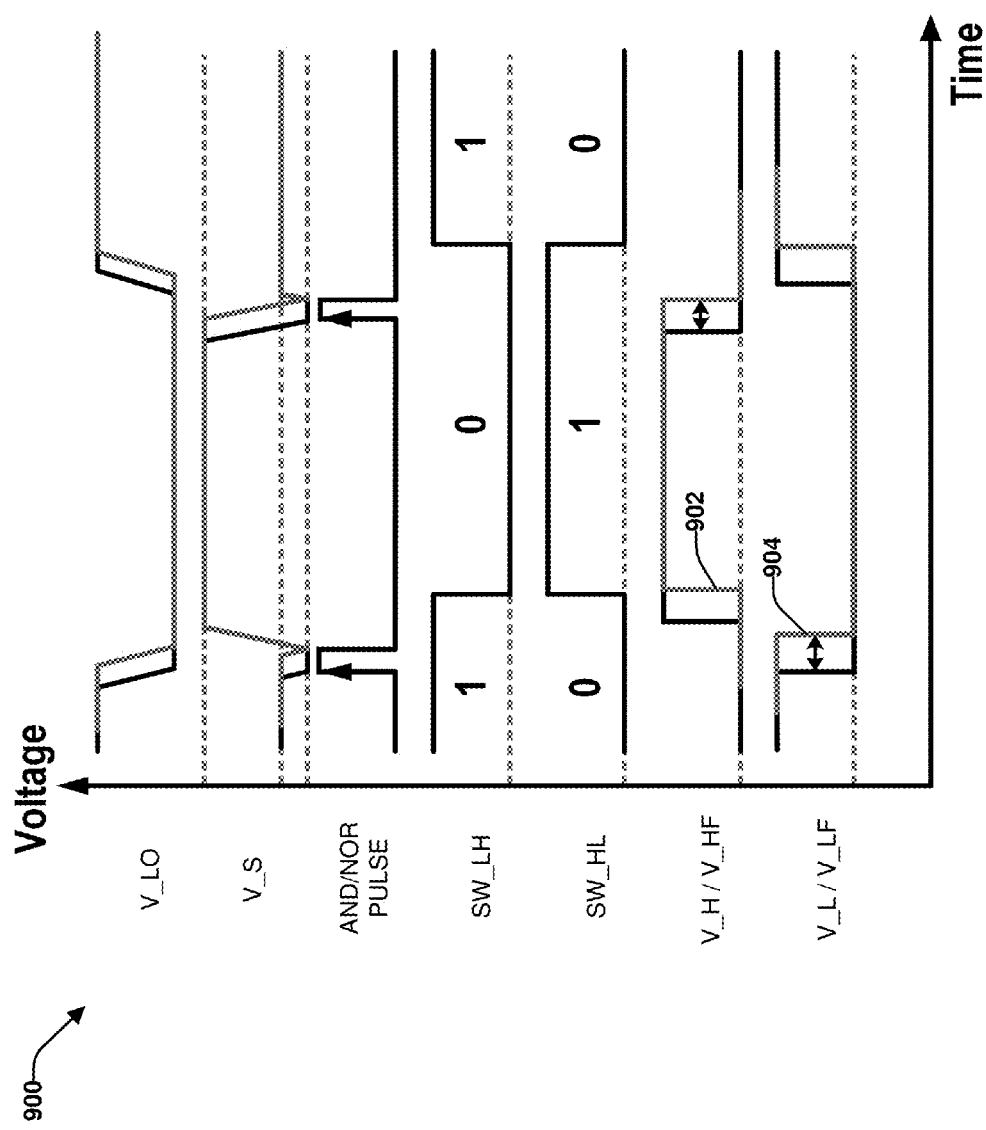
FIG. 9 presents an example timing diagram associated a second dead-time tuner, in accordance with one or more embodiments described herein.

Referring to FIG. 9, illustrated is example timing diagram 900 in accordance with one or more embodiments described herein. The timing diagram 900 can be associated with the second dead-time tuner 114. The timing diagram 900 illustrates an example gate signal V_LO received by the second dead-time tuner 114, an example switching signal V_S received by the second dead-time tuner 114, an example pulse signal AND/NOR PULSE generated by the NOR logic gate 402, the AND logic gate 404, the AND logic gate 406 and/or the NOR logic gate 408 of the second dead-time tuner 114, an example flag signal SW_LH received by the second dead-time tuner 114, and an example flag signal SW_HL received by the second dead-time tuner 114. The timing diagram 900 also illustrates an example control signal V_H received by the second dead-time tuner 114, an example control signal V_HF generated by the second dead-time tuner 114, an example control signal V_L received by the second dead-time tuner 114, and an example control signal V_LF generated by the second dead-time tuner 114. As shown by a voltage waveform 902 associated with the modified control signal V_HF, a dead-time value of the modified control signal V_HF can tuned with respect to the control signal V_H via a step-by-step tuning process (e.g., a multi-step tuning process) associated with the second dead-time tuner 114. For example, a dead-time value of the modified control signal V_HL can be greater than or less than a dead-time value of the control signal V_H. Furthermore, as shown by a voltage waveform 904 associated with the modified control signal V_LF, a dead-time value of the modified control signal V_HF can be tuned with respect to the control signal V_L via a step-by-step tuning process (e.g., a multi-step tuning process) associated with the second dead-time tuner 114. For example, a dead-time value of the modified control signal V_LF can be greater than or less than a dead-time value of the control signal V_L.

Figure 10:
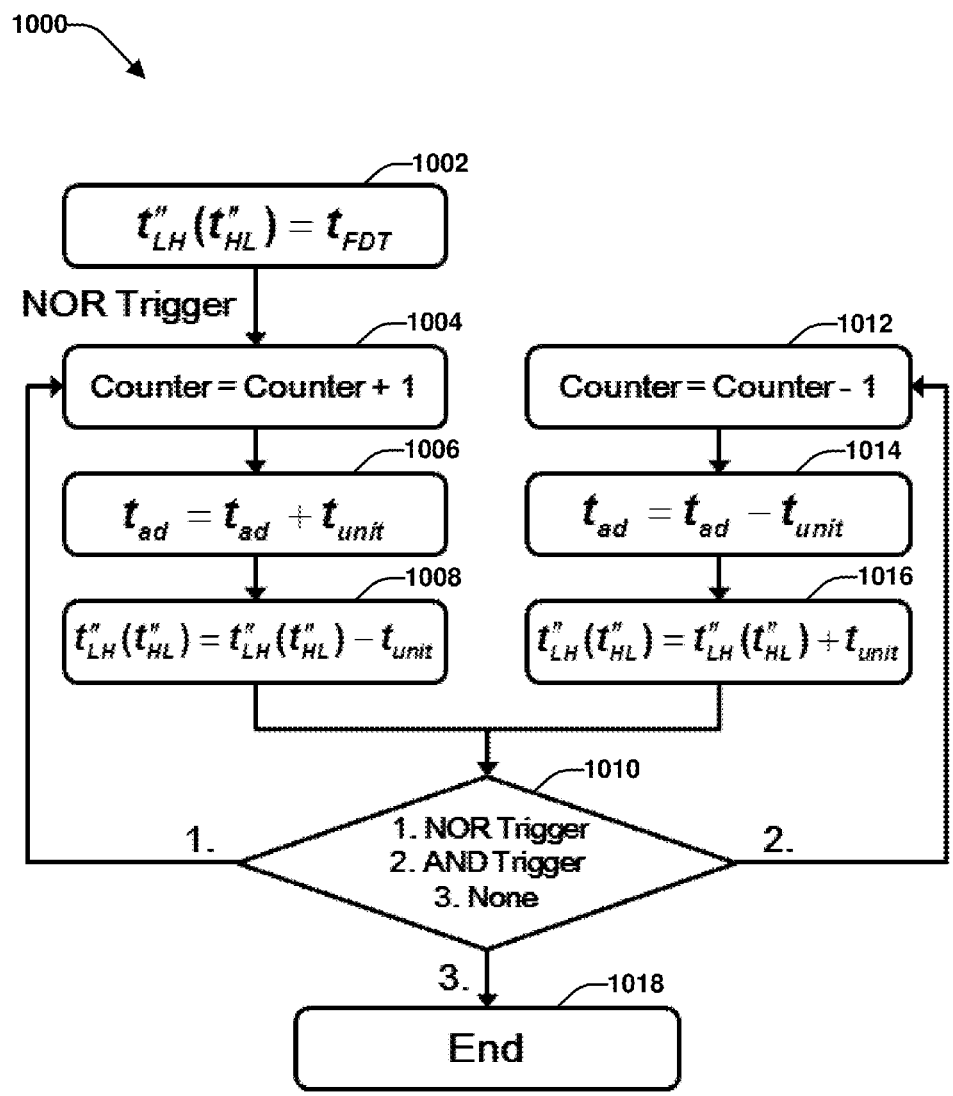
FIG. 10 presents a flow diagram of an example method for performing a tuning process, in accordance with one or more embodiments described herein.

Turning now to FIG. 10, presented is a high level flow diagram of an example method 1000 for performing a tuning process, in accordance with aspects and embodiments described herein. The method 1000 can be associated with the second dead-time tuner 114. At 1002, it is determined whether a dead-time value Cm (or a dead-time value $t''_{HL}$) equals a defined time value $t_{FDT}$. If the dead-time value Cm (or the dead-time value $t''_{HL}$) equals the defined time value $t_{FDT}$, a NOR logic gate is triggered. For example, the NOR logic gate 402 or the NOR logic gate 408 can be triggered.

At 1004, a counter is incremented. For example, the counter 412 or the counter 420 can be incremented. At 1006, adjustable delay $t_{ad}$ is incremented by a single unit delay time tuna. Then, at 1008, the dead-time value Cm (or the dead-time value $t''_{HL}$) is decreased by the single unit delay time $t_{unit}$. For example, the adjustable delay stage 416 can increase a delay time between the control signal V_H and the modified control signal V_HF, thereby decreasing a dead-time value associated with the modified control signal V_HF. Alternatively, the adjustable delay stage 424 can increase a delay time between the control signal V_L and the modified control signal V_HL, thereby decreasing a dead-time value associated with the modified control signal V_HL. At 1010, it is determined whether a NOR logic gate is triggered, whether an AND logic gate is triggered, or whether no logic gates are triggered. For example, it can be determined whether the NOR logic gate 402 is triggered, whether the AND logic gate 404 is triggered, whether the AND logic gate 406 is triggered, or whether the NOR logic gate 408 is triggered. If a NOR logic gate is triggered, the method 1000 can return to 1004. If an AND logic gate is triggered, the method 1000 can proceed to 1012. At 1012, a counter is decremented. For example, the counter 412 or the counter 420 can be decremented. At 1014, adjustable delay $t_{ad}$ is decremented by a single unit delay time $t_{unit}$. Then, at 1016, the dead-time value Cm (or the dead-time value $t''_{HL}$) is increased by the single unit delay time $t_{unit}$. For example, the adjustable delay stage 416 can modify a delay time between the control signal V_H and the modified control signal V_HF, thereby increasing a dead-time value associated with the modified control signal V_HF. Alternatively, the adjustable delay stage 424 can modify a delay time between the control signal V_L and the modified control signal V_HL, thereby increasing a dead-time value associated with the modified control signal V_HL. If neither the NOR logic gate nor the AND logic gate is triggered, the method 1000 can complete a step-by-step tuning process at 1018.

Figure 11:
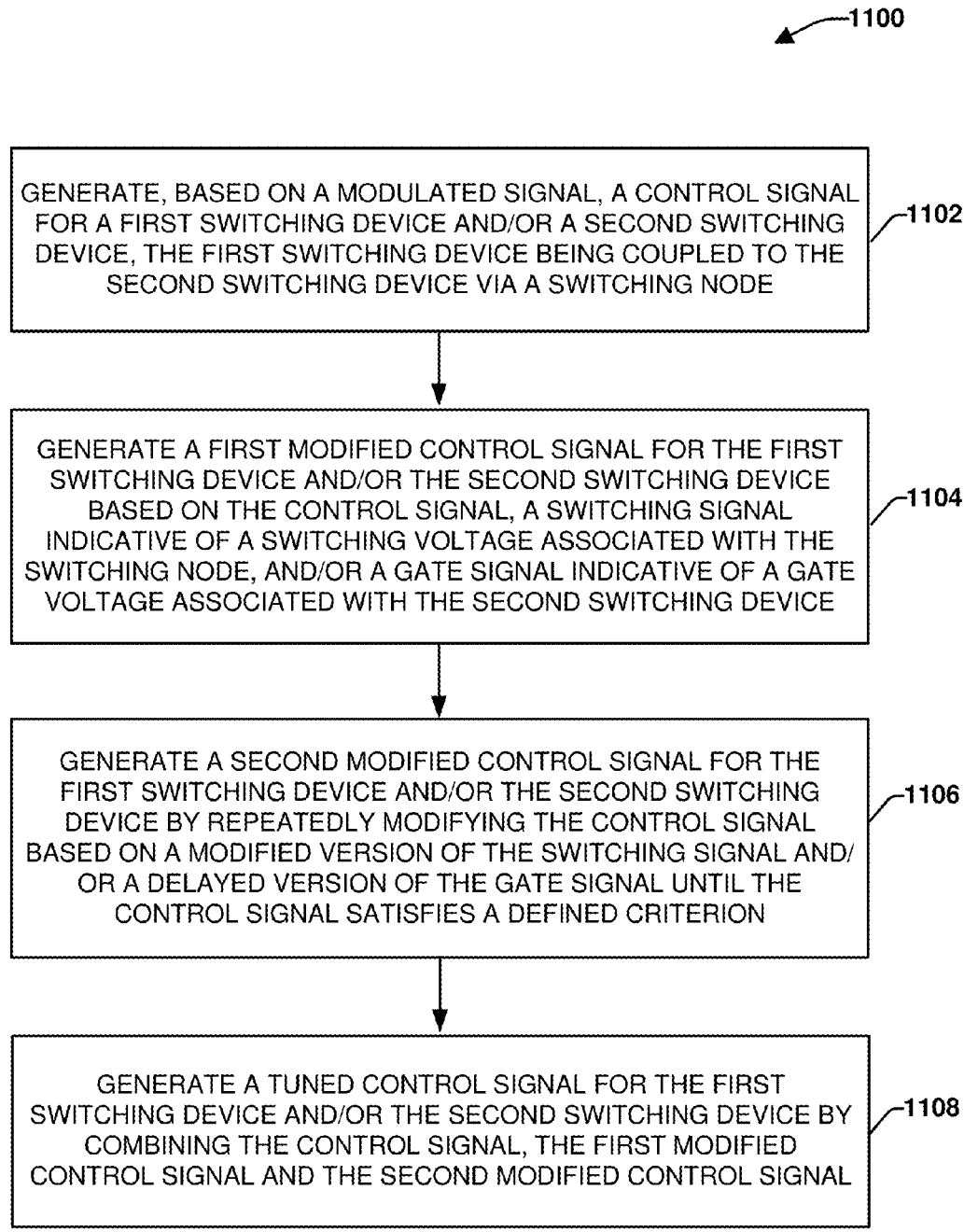
FIG. 11 presents a flow diagram of an example method for generating a control signal to drive a gate of a switching device, in accordance with one or more embodiments described herein.

Turning now to FIG. 11, presented is a high level flow diagram of an example method 1100 for generating a control signal to drive a gate of a switching device, in accordance with aspects and embodiments described herein. The method 1100 can be associated with the digital dead-time correction device 102. At 1102, a control signal for a first switching device and/or a second switching device is generated (e.g., using dead-time generator 108) based on a modulated signal. The first switching device can be coupled to the second switching device via a switching node. The first switching device can be a first transistor such as, for example, a first GaN HEMT. Furthermore, the second switching device can be a second transistor such as, for example, a second GaN HEMT. The control signal can be capable of driving a gate of the first switching device and/or the second switching device. In an aspect, the switching node can be a node that couples a drain of the first switching device to a source of the second switching device. In one example, the modulated signal can be a pulse width modulation signal.

At 1104, a first modified control signal for the first switching device and/or the second switching device is generated (e.g., using first dead-time tuner 112) based on the control signal, a switching signal indicative of a switching voltage associated with the switching node, and/or a gate signal indicative of a gate voltage associated with the second switching device. The first modified control signal can be capable of driving a gate of the first switching device and/or the second switching device. Furthermore, the first modified control signal can be associated with a different dead-time value (e.g., a lower dead-time value) than the control signal. In an aspect, the first modified control signal can be generated based on the control signal, the switching signal and/or the gate signal during a single-step tuning process. The single-step tuning process can employ at least one flip-flop device controlled based on a flag signal that indicates a voltage state of the voltage associated with the switching node. For example, the flag signal can indicate whether the first switching device and/or the second switching device is transitioning to an on state or an off state.

At 1106, a second modified control signal for the first switching device and/or the second switching device is generated (e.g., using second dead-time tuner 114) by repeatedly modifying the control signal based on a modified version of the switching signal and/or a time-delayed version of the gate signal until the control signal satisfies a defined criterion. For example, the control signal can be repeatedly modified until a dead-time value for the control signal satisfies a defined criterion (e.g., a dead-time value for the control signal reaches a defined dead-time level, etc.). The modified version of the switching signal can comprise a lower level of voltage than the switching signal. Furthermore, the time-delayed version of the gate signal can be generated by delaying the gate signal via one or more delay stages. The second modified control signal can be capable of driving a gate of the first switching device and/or the second switching device. Furthermore, the second modified control signal can be associated with a different dead-time value (e.g., a lower dead-time value) than the control signal and/or the first modified control signal. In an aspect, the second modified control signal can be generated based on the control signal, the modified version of the switching signal and/or the time-delayed version of the gate signal during a step-by-step tuning process (e.g., a multi-step tuning process). The step-by-step tuning process (e.g., the multi-step tuning process) can employ at least a counter and an adjustable delay stage to repeatedly tune the control signal into the second modified control signal via two or more tuning cycles for the control signal.

At 1108, a tuned control signal for the first switching device and/or the second switching device is generated (e.g., using first digital combiner 116 and/or second digital combiner 118) by combining the control signal, the first modified control signal and the second modified control signal. For example, a first waveform associated with the control signal, a second waveform associated with the first modified control signal and/or a third waveform associated with the second modified control signal can be combined to form the tuned control signal. The tuned control signal can drive a gate of the first switching device and/or the second switching device. Furthermore, the tuned control signal can be associated with a different dead-time value (e.g., a lower dead-time value) than the control signal, the first modified control signal and/or the second modified control signal.

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A device, comprising:
   a dead-time generator circuit configured to generate, based on a modulated signal, a control signal for a first switching device that is coupled to a second switching device via a switching node, wherein the control signal is associated with a first dead-time value indicative of an interval of time that is added to a switching operation associated with the first switching device;
   a first dead-time tuner circuit configured to generate, based on the control signal and a switching signal indicative of a voltage associated with the switching node, a first modified control signal for the first switching device;
   a second dead-time tuner circuit configured to generate, based on a modified version of the switching signal and a tuning process that repeatedly modifies the control signal until the first dead-time value satisfies a defined criterion, a second modified control signal for the first switching device; and
   a digital circuit configured to combine the control signal, the first modified control signal and the second modified control signal to generate a gate-drive control signal for the first switching device, wherein the gate-drive control signal is associated with a second dead-time value that is less than the first dead-time value.

2. The device of claim 1, wherein the voltage is a first voltage, and wherein the first dead-time tuner circuit is configured to generate the first modified control signal based on the control signal, the switching signal and a gate signal indicative of a second voltage associated with a gate node for the second switching device.

3. The device of claim 2, wherein the first dead-time tuner circuit is configured to generate the first modified control signal based on a comparison between the switching signal and the gate signal.

4. The device of claim 1, wherein the control signal is a first control signal, wherein the first dead-time tuner circuit is further configured to generate, based on the switching signal and a second control signal for the second switching device, a third modified control signal for the second switching device, and wherein the second control signal is associated with the first dead-time value.

5. The device of claim 4, wherein the tuning process is a first tuning process, and wherein the second dead-time tuner circuit is configured to generate, based on the modified version of the switching signal and a second tuning process that repeatedly modifies the second control signal until the first dead-time value satisfies the defined criterion, a fourth modified control signal for the second switching device.

6. The device of claim 5, wherein the gate-drive control signal is a first gate-drive control signal, and wherein the digital circuit combines the second control signal, the third modified control signal and the fourth modified control signal to generate a second gate-drive control signal for the second switching device, wherein the second gate-drive control signal is associated with the second dead-time value.

7. The device of claim 1, wherein the voltage is a first voltage, and wherein the control signal is a first control signal, wherein the first dead-time tuner circuit is further configured to generate, based on the switching signal, a second control signal for the second switching device and a gate signal indicative of a second voltage associated with a gate node for the second switching device, a third modified control signal for the second switching device, and wherein the second control signal is associated with the first dead-time value.

8. The device of claim 1, wherein the dead-time generator circuit is further configured to generate a flag signal that indicates a voltage state of the voltage associated with the switching node, and wherein the first dead-time tuner circuit is configured to generate the first modified control signal based on the control signal, the switching signal and the flag signal.

9. The device of claim 1, wherein the first switching device is a first gallium nitride (GaN) high electron mobility transistor (HEMT) and the second switching device is a second GaN HEMT.

10. A system, comprising:
    a buffer amplifier coupled to a first transistor device and a second transistor device, wherein the first transistor device is coupled to the second transistor device via a switching node;
    a dead-time generator configured to generate, based on a digital signal, a gate-drive signal with a first dead-time value that is indicative of a time period added to a switching operation for the first transistor device; and
    a dead-time tuner, wherein the dead-time tuner comprises:
       a first dead-time tuner configured to modify, based on a switching signal indicative of a switching voltage associated with the switching node, the gate-drive signal to generate a first modified gate-drive signal; and
       a second dead-time tuner configured to modify, based on a modified version of the switching signal and a tuning process that repeatedly modifies the gate-drive signal until the first dead-time value satisfies a defined criterion, the gate-drive signal to generate a second modified gate-drive signal, wherein the gate-drive signal, the first modified gate-drive signal and the second modified gate-drive signal are combined to generate a tuned gate-drive signal for the first transistor device, wherein the tuned gate-drive signal is associated with a second dead-time value that is less than the first dead-time value.

11. The system of claim 10, wherein the first dead-time tuner is configured to generate the first modified gate-drive signal based on the gate-drive signal, the switching signal and a gate signal indicative of a gate voltage associated with a gate node for the second transistor device.

12. The system of claim 11, wherein the first dead-time tuner is configured to generate the first modified gate-drive signal based on a digital comparison between the switching signal and the gate signal.

13. The system of claim 10, wherein the second dead-time tuner is configured to generate the second modified gate-drive signal based on based on a time-delayed version of the gate-drive signal, the modified version of the switching signal, and the tuning process.

14. The system of claim 10, wherein the dead-time generator is further configured to generate a flag signal that indicates a voltage state of the switching voltage associated with the switching node, and wherein the second dead-time tuner is configured to generate the second modified gate-drive signal based on the flag signal, the modified version of the switching signal and the tuning process.

15. The system of claim 10, wherein the first transistor device is a first gallium nitride (GaN) transistor device and the second transistor device is a second GaN transistor device.

16. The system of claim 10, wherein the buffer amplifier transmits the tuned gate-drive signal to the first transistor device.

17. A method, comprising:
  generating, based on a pulse width modulation signal, a control signal for a first switching device that is coupled to a second switching device via a switching node;
  generating, based on the control signal and a switching signal indicative of a switching voltage associated with the switching node, a first modified control signal for the first switching device;
  generating a second modified control signal for the first switching device by repeatedly modifying the control signal based on a modified version of the switching signal until the control signal satisfies a defined criterion; and
  generating a tuned control signal for the first switching device by combining the control signal, the first modified control signal and the second modified control signal.

18. The method of claim 17, wherein the generating the first modified control signal comprises generating the first modified control signal based on the control signal, the switching signal and a gate signal indicative of a gate voltage associated with a gate node for the second switching device.

19. The method of claim 18, wherein the generating the second modified control signal comprises generating the second modified control signal by repeatedly modifying the control signal based on the modified version of the switching signal and a time-delayed version of the gate signal until the control signal satisfies the defined criterion.

20. The method of claim 17, further comprising modifying a voltage level of the tuned control signal and transmitting the tuned control signal to the first switching device.

* * * * *